United States Patent
Lee et al.

(10) Patent No.: US 11,635,835 B2
(45) Date of Patent: Apr. 25, 2023

(54) TOUCH DISPLAY DEVICE

(71) Applicant: LG Display Co., Ltd., Seoul (KR)

(72) Inventors: Jung Eun Lee, Seoul (KR); Kyong Ha Lee, Seoul (KR); Tae Gyu Lee, Paju-si (KR); Tae Hwan Kim, Goyang-si (KR); Eun Hye Lee, Paju-si (KR); Hyeon Chul Im, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/553,204

(22) Filed: Dec. 16, 2021

(65) Prior Publication Data

US 2022/0206617 A1   Jun. 30, 2022

(30) Foreign Application Priority Data

Dec. 31, 2020   (KR) .................. 10-2020-0190018

(51) Int. Cl.
| | |
|---|---|
| *G06F 3/041* | (2006.01) |
| *G06F 3/044* | (2006.01) |
| *H01L 27/32* | (2006.01) |

(52) U.S. Cl.
CPC ............ *G06F 3/0412* (2013.01); *G06F 3/044* (2013.01); *H01L 27/323* (2013.01)

(58) Field of Classification Search
CPC ....... G06F 3/0412; G06F 3/044; H01L 27/323
See application file for complete search history.

(56) References Cited

U.S. PATENT DOCUMENTS

| | | | |
|---|---|---|---|
| 9,130,181 B2 | 9/2015 | Choi et al. | |
| 9,196,662 B2 | 11/2015 | Choi et al. | |
| 10,310,650 B2 | 6/2019 | Heo et al. | |
| 10,409,411 B2 | 9/2019 | Heo et al. | |
| 10,418,424 B2 | 9/2019 | Oh et al. | |
| 10,490,610 B2 | 11/2019 | Kim | |
| 10,877,584 B2 | 12/2020 | Lee et al. | |
| 11,009,976 B2 | 5/2021 | Yang et al. | |
| 2014/0061597 A1 | 3/2014 | Choi et al. | |
| 2015/0185942 A1* | 7/2015 | Kim ..................... H01L 27/323 |
| | | | 345/173 |
| 2015/0249114 A1 | 9/2015 | Choi et al. | |
| 2016/0320885 A1* | 11/2016 | Kim ..................... G06F 3/0446 |
| 2017/0090634 A1 | 3/2017 | Yang et al. | |

(Continued)

FOREIGN PATENT DOCUMENTS

| | | |
|---|---|---|
| CN | 108258011 A | 7/2018 |
| EP | 3301553 A1 | 4/2018 |

(Continued)

OTHER PUBLICATIONS

Extended European Search Report, European Patent Office Application No. 21215976.8, dated May 25, 2022, 9 pages.

(Continued)

*Primary Examiner* — Hong Zhou
(74) *Attorney, Agent, or Firm* — Fenwick & West LLP

(57) ABSTRACT

A touch display device includes light emitting devices disposed on a substrate, an encapsulation unit disposed on the light emitting devices, a touch buffer film disposed on the encapsulation unit, second bridge electrodes disposed on the touch buffer film, a black matrix disposed on the touch buffer film and including openings, color filters that fill the openings, and a cover layer disposed on the color filters and the black matrix.

16 Claims, 14 Drawing Sheets

(56) References Cited

U.S. PATENT DOCUMENTS

| | | | |
|---|---|---|---|
| 2018/0032193 A1 | 2/2018 | Qu | |
| 2018/0061897 A1* | 3/2018 | Oh | H01L 27/3246 |
| 2018/0061898 A1 | 3/2018 | Oh et al. | |
| 2018/0095566 A1 | 4/2018 | Lee et al. | |
| 2018/0095570 A1* | 4/2018 | Hong | H01L 27/323 |
| 2018/0175115 A1* | 6/2018 | Choi | H01L 27/322 |
| 2018/0181240 A1 | 6/2018 | Heo et al. | |
| 2018/0182818 A1 | 6/2018 | Kim | |
| 2018/0342560 A1* | 11/2018 | Ma | H01L 51/5284 |
| 2019/0064960 A1 | 2/2019 | Na et al. | |
| 2019/0129539 A1* | 5/2019 | Kim | G01R 27/2605 |
| 2019/0187850 A1 | 6/2019 | Kim et al. | |
| 2019/0220126 A1 | 7/2019 | Heo et al. | |
| 2019/0341428 A1 | 11/2019 | Lee et al. | |
| 2020/0152708 A1* | 5/2020 | Kim | G06F 3/0412 |
| 2020/0388731 A1* | 12/2020 | Cha | H01L 27/15 |
| 2020/0403039 A1* | 12/2020 | Park | H01L 27/323 |
| 2021/0103352 A1 | 4/2021 | Lee et al. | |
| 2021/0232250 A1 | 7/2021 | Yang et al. | |

FOREIGN PATENT DOCUMENTS

| | | |
|---|---|---|
| JP | 2002-148429 A | 5/2002 |
| JP | 2009-198904 A | 9/2009 |
| JP | 2014-049436 A | 3/2014 |
| JP | 2018-106698 A | 7/2018 |
| JP | 2018-109962 A | 7/2018 |
| KR | 10-2014-0143498 A | 12/2014 |
| KR | 10-2017-0036217 A | 4/2017 |
| KR | 10-2018-0036325 A | 4/2018 |
| KR | 10-2018-0076689 A | 7/2018 |
| TW | 201813077 A | 4/2018 |

OTHER PUBLICATIONS

Japan Patent Office, Office Action, JP Patent Application No. 2021-205923, dated Jan. 5, 2023, ten pages.

Taiwan Intellectual Property Office, TW Patent Application No. 110148600, dated Jan. 9, 2023, 12 pages.

* cited by examiner

TOUCH DISPLAY DEVICE

CROSS-REFERENCE TO RELATED APPLICATIONS

This application claims the priority benefit of Republic of Korea Patent Application No. 10-2020-0190018 filed on Dec. 31, 2020, which is incorporated by reference in its entirety.

BACKGROUND

Technical Field

The present disclosure relates to a display device, and more particularly, to a touch display device, the structure and manufacturing process of which may be simplified.

Discussion of the Related Art

A touchscreen is an input device which may input user commands by selecting instructions displayed on a screen of a display device or the like with a human hand or an object. For example, the touchscreen converts a contact position directly contacting the human hand or the object into an electrical signal, and accepts instructions selected at the contact position as an input signal. Because such a touchscreen may replace a separate input device, which is connected to the display device so as to be operated, such as a keyboard or a mouse, the usage range of the touchscreen tends to be gradually extended.

In order to improve convenience of manufacture of display devices and to reduce the sizes of the display devices, attempts to install a touchscreen within a display panel, such as a liquid crystal display panel or an organic light emitting display panel, are being made.

However, as the touchscreen is provided in the display panel, the structure and the manufacturing process of a display device may be complicated, and the manufacturing costs of the display device may increase.

SUMMARY

Accordingly, the present disclosure is directed to a touch display device that substantially obviates or at least reduces one or more problems due to limitations and disadvantages of the related art.

An object of the present disclosure is to provide a touch display device, the structure and manufacturing process of which may be simplified by replacing a touch insulating film with a black matrix and embedding color filters in the black matrix.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a touch display device includes light emitting devices disposed on a substrate, an encapsulation unit disposed on the light emitting devices, a touch buffer film disposed on the encapsulation unit, second bridge electrodes disposed on the touch buffer film, a black matrix disposed on the touch buffer film and including openings, color filters configured to fill the openings, and a cover layer disposed on the color filters and the black matrix.

The touch display device may further include touch contact holes formed through the black matrix to expose a part of each of the second bridge electrodes, a second sensor layer disposed on the black matrix, the second sensor layer including second touch electrodes disposed in the touch contact holes and connected to the second bridge electrodes, and a first sensor layer disposed on the black matrix, first sensor layer including first touch electrodes and first bridge electrodes.

Each of the openings may have a lower surface configured to serve as an upper surface of the touch buffer film, and a side surface configured to serve as an exposed side surface of the black matrix.

The touch buffer film may be formed of a hydrophilic material with a strong affinity for the color filters, and the black matrix may be formed of a hydrophobic material repelling a material of the color filters.

The color filters may have a convex shape based on an upper surface of the black matrix.

The color filters may be formed to have a protruding surface from an upper surface of the black matrix, the protruding surface forming a step with the upper surface of the black matrix.

An upper portion of each of the openings may be greater in size than a lower portion of each of the openings.

The touch display device may further include an active area in which the light emitting devices are disposed, and a bezel area disposed adjacent to the active area, the bezel area may include a first bezel area disposed adjacent to the active area such that ends of the encapsulation unit are disposed therein, a pad area in which touch pads are disposed, and a second bezel area disposed between the first bezel area and the pad area, and the touch pads may be conductively connected to routing lines configured to extend from the active area.

The routing lines may be disposed on the black matrix in the first bezel area and the active area, and may be disposed on the touch buffer film in the second bezel area.

Each of the touch pads may include a first touch pad electrode disposed on the substrate so that the touch buffer film is disposed on the first touch pad electrode, a second touch pad electrode disposed on the first touch pad electrode, and a third touch pad electrode disposed on the second touch pad electrode, wherein the touch buffer film has a first touch pad contact hole that exposes first touch pad electrode, and the second touch pad electrode may be disposed on the touch buffer film to contact to the first touch pad electrode.

The first touch pad electrode may be formed of the same metal as source and drain electrodes of thin film transistors formed on the substrate, the second touch pad electrode may be formed of the same metal as the second bridge electrodes, and the third touch pad electrode may be formed of the same metal as a first sensor layer disposed on an upper surface of the black matrix.

The cover layer may comprise a passivation layer disposed on the black matrix, a black optical adhesive layer disposed on the passivation layer, and a cover window disposed on the black optical adhesive layer.

The cover layer may include a first optical adhesive layer disposed on the black matrix, a polarization layer disposed on the first optical adhesive layer, a second optical adhesive layer disposed on the polarization layer, and a cover window disposed on the second optical adhesive layer.

The cover layer may include a passivation layer disposed on the black matrix, a first optical adhesive layer disposed on the passivation layer, a polarization layer disposed on the first optical adhesive layer, a second optical adhesive layer disposed on the polarization layer, and a cover window layer disposed on the second optical adhesive layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
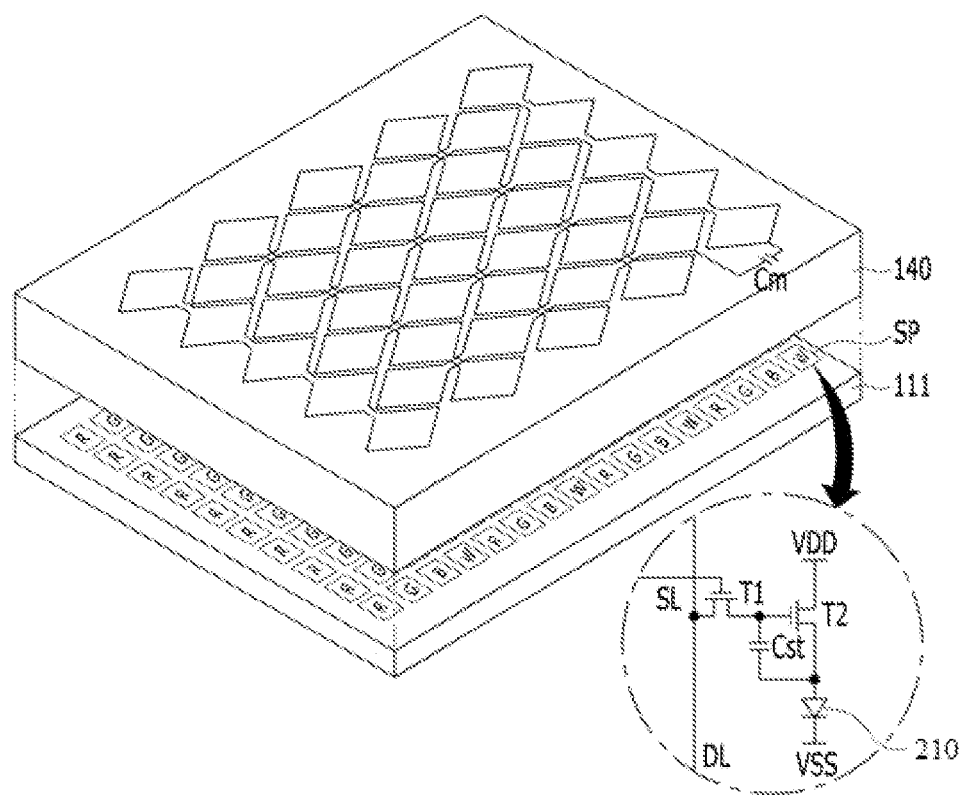
FIG. 1 is a perspective view illustrating a display device according to one embodiment of the present disclosure.

Reference will now be made in detail to the exemplary embodiments of the present disclosure, examples of which are illustrated in the accompanying drawings. In the following description of the embodiments and the drawings, the same or similar elements are denoted by the same reference numerals throughout the specification. In the following description of the embodiments of the present disclosure, a detailed description of known functions and configurations incorporated herein will be omitted when it may make the subject matter of the present disclosure rather unclear. Further, in the following description of the embodiments of the present disclosure, elements of several embodiments, which are substantially the same, will be described at once in the first embodiment, and then a redundant description thereof will be omitted in other embodiments to avoid redundancy.

In the following description of the embodiments, it will be understood that, when the terms "first", "second", etc. are used to describe various elements, and these elements are not limited by these terms. These terms are used merely to distinguish the same or similar elements.

Respective features of the various embodiments of the present disclosure may be partially or wholly coupled to or combined with each other and be interlocked or driven in various technical manners, and the respective embodiments may be implemented independently of each other or be implemented together through connection there between.

Hereinafter, exemplary embodiments of the present disclosure will be described in detail with reference to the accompanying drawings.

Figure 2:
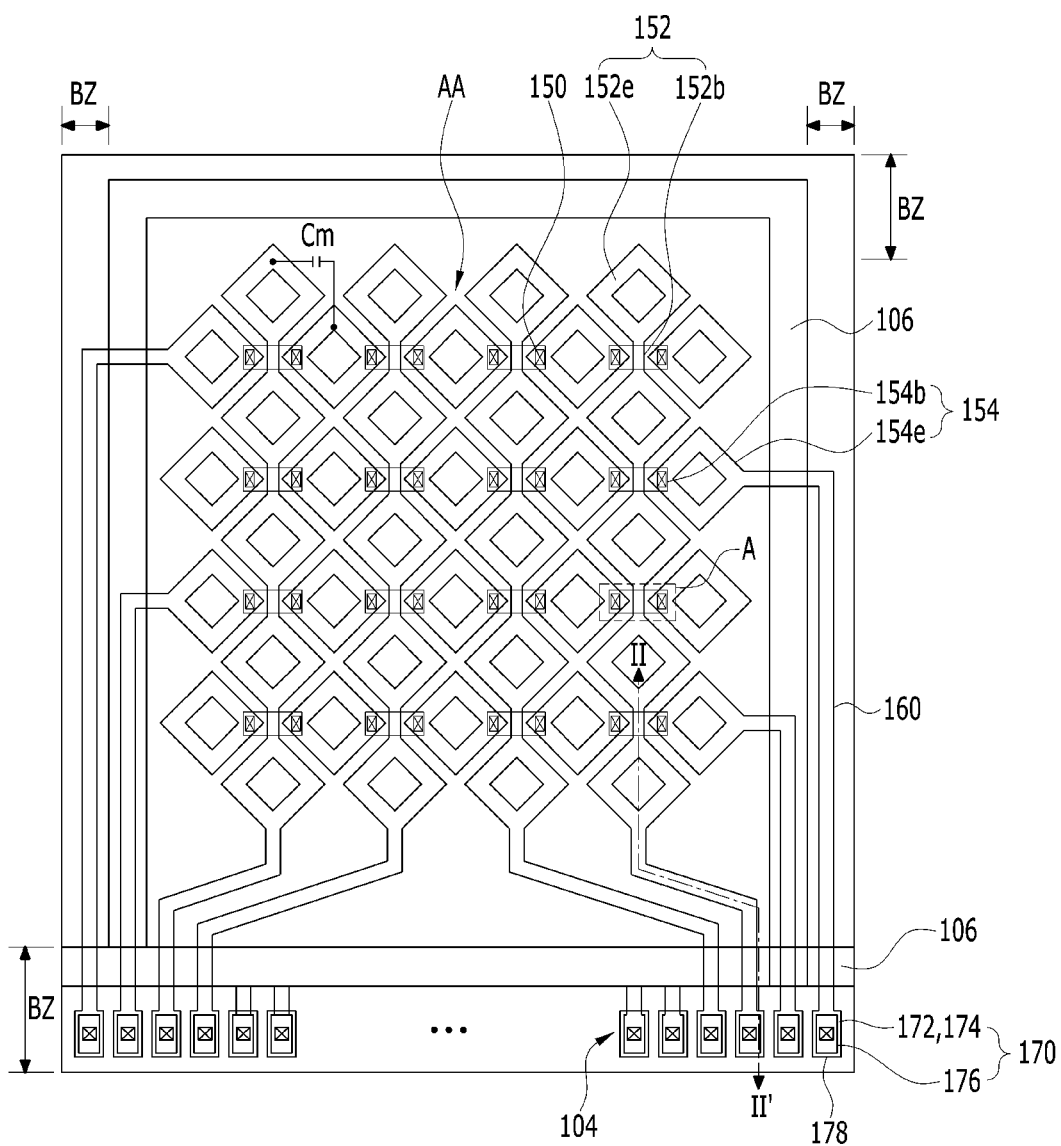
FIG. 2 is a plan view illustrating the touch display device shown in FIG. 1 according to one embodiment of the present disclosure.
Figure 3:
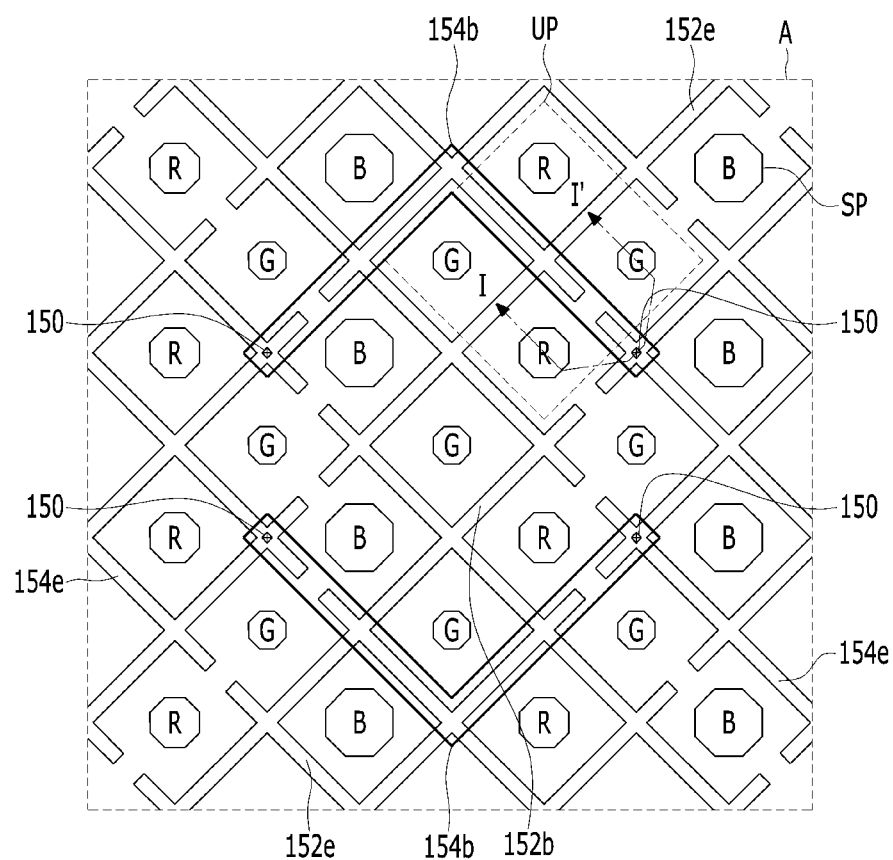
FIG. 3 is an enlarged plan view of portion A of FIG. 2 according to one embodiment of the present disclosure.
Figure 4:
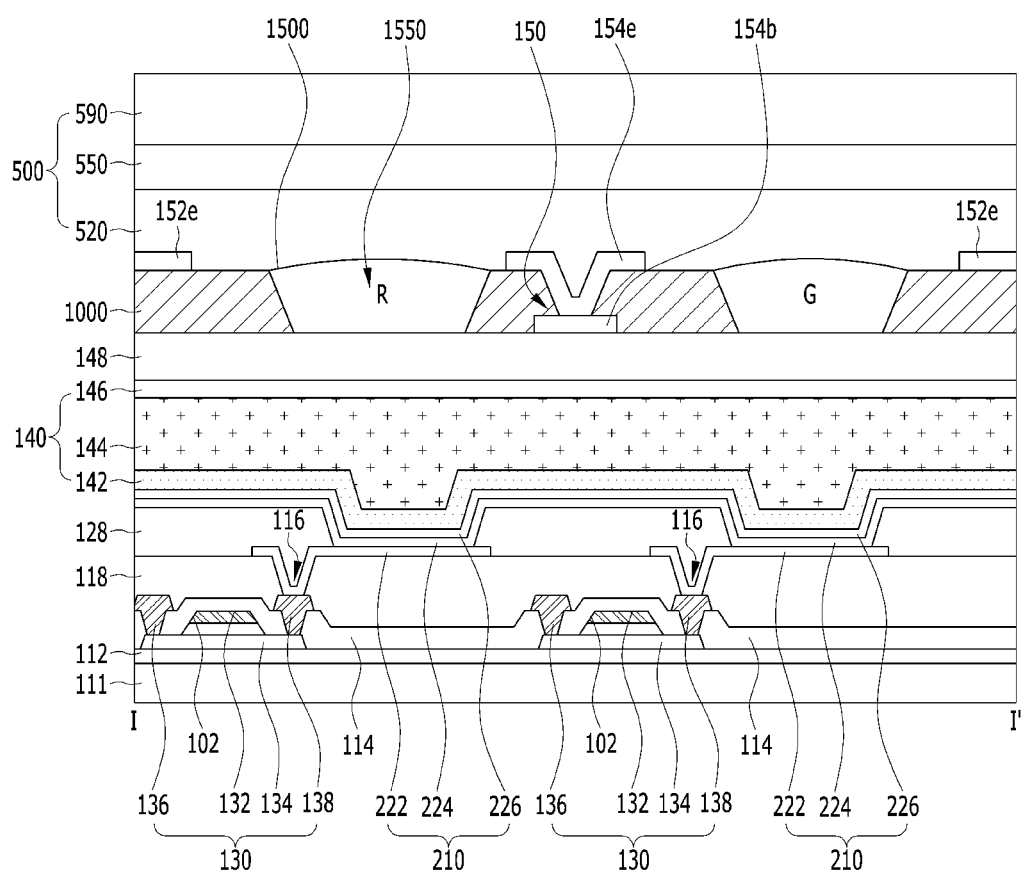
FIG. 4 is a longitudinal-sectional view taken along line I-I' of FIG. 3 according to one embodiment of the present disclosure.
Figure 5:
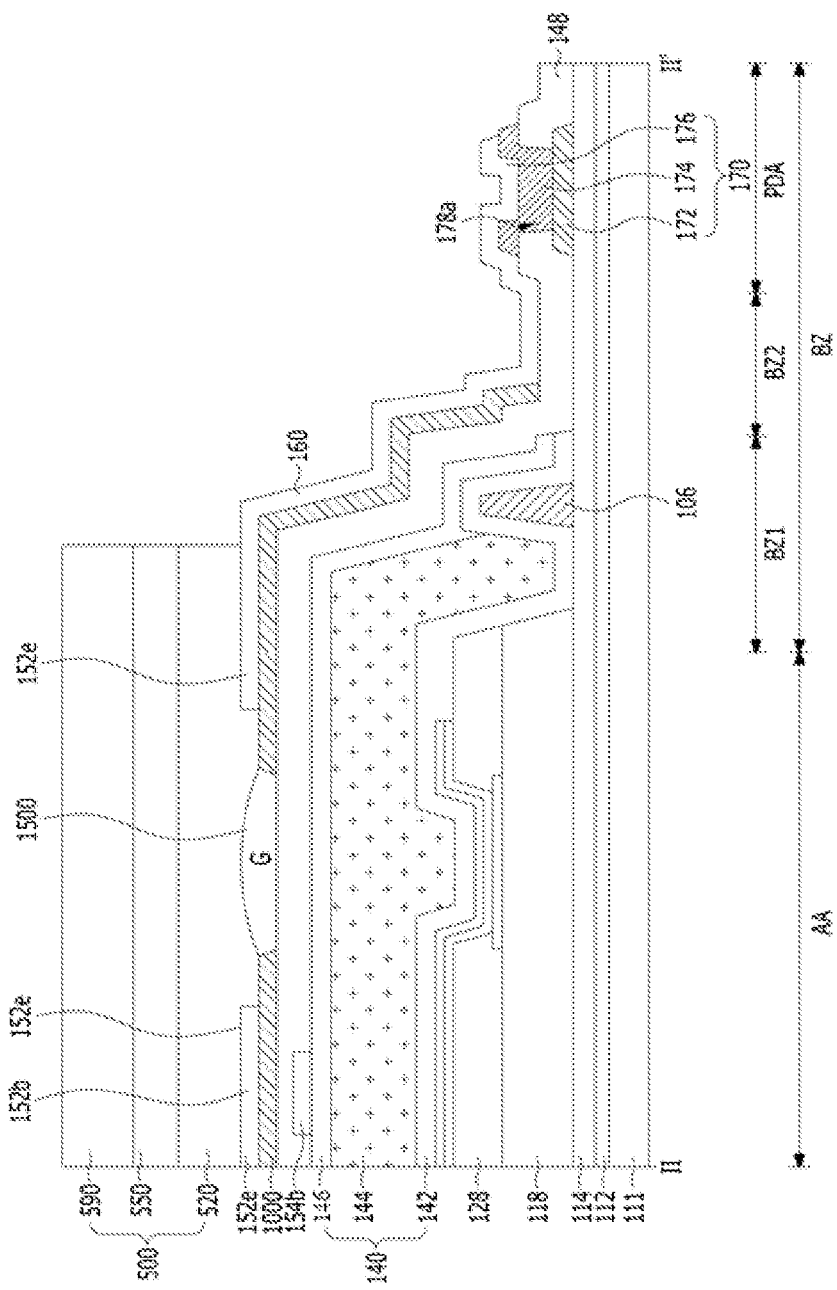
FIG. 5 is a longitudinal-sectional view taken along line II-II' of FIG. 2 according to one embodiment of the present disclosure.

FIG. 1 is a perspective view illustrating a display device according to one embodiment of the present disclosure, and FIG. 2 is a plan view illustrating the touch display device shown in FIG. 1, according to one embodiment of the present disclosure. Further, FIG. 3 is an enlarged plan view of portion A of FIG. 2, FIG. 4 is a longitudinal-sectional view taken along line I-I' of FIG. 3, and FIG. 5 is a longitudinal-sectional view taken along line II-II' of FIG. 2, according to one embodiment of the present disclosure.

Referring to FIGS. 1 to 5, a touch display device 1 according to one embodiment of the present disclosure senses changes in mutual capacitances Cm (touch sensors) by a user touch through touch electrodes 152e and 154e, and thus senses whether or not there is a touch and a touch position.

Further, the touch display device 1 having the touch sensors shown in FIG. 1 displays an image through unit pixels including light emitting devices 210. As shown in FIG. 1, the unit pixel may include red (R), green (G) and blue (B) subpixels SP arranged in a row. Alternatively, the unit pixel may include red (R), green (G), blue (B) and white (W) subpixels SP. As shown in FIG. 3, the unit pixel may be formed in a pentile structure. Referring to FIG. 3, the unit pixel having the pentile structure may include one red (R) subpixel SP, one blue (B) subpixel SP and two green (G) subpixels SP.

The touch display device 1 may include a plurality of subpixels SP arranged in a matrix on a substrate 111, an encapsulation unit 140 disposed on the subpixels SP, and the touch sensors Cm disposed on the encapsulation unit 140.

Each of the subpixels SP include a pixel driving circuit, and the light emitting device 210 connected to the pixel driving circuit.

The pixel driving circuit includes a switching transistor T1, a driving transistor T2 and a storage capacitor Cst. Although the present disclosure exemplarily describes the pixel driving circuit as having a structure including two transistors T and one capacitor C, the pixel driving circuit is not limited thereto. For example, the pixel driving circuit having a 3T1C structure or a 3T2C structure including three or more transistors T and one or more capacitors C may be used.

The switching transistor T1 is turned on, when a scan pulse is applied to a scan line SL, and supplies a data signal supplied to a data line DL to the storage capacitor Cst and a gate electrode of the driving transistor T2.

The driving transistor T2 controls current I supplied from a high voltage (VDD) supply line to the light emitting device 210 in response to the data signal to the gate electrode of the corresponding driving transistor T2, thereby adjusting the amount of light emitted by the light emitting device 210. Further, even though the switching transistor T1 is turned off, the driving transistor T2 supplies regular current to the light emitting device 210 due to voltage charging the storage capacitor Cst so that the light emitting device 210 maintains light emission, until a data signal of the next frame is supplied to the driving transistor T2.

As shown in FIG. 4, the driving thin film transistor 130 (T2) includes a semiconductor layer 134 disposed on a buffer layer 112, a gate electrode 132 configured to overlap the semiconductor layer 134 with a gate insulating film 102 interposed there between, and source electrode 136 and drain electrode 138 formed on an interlayer insulating film 114 so as to contact the semiconductor layer 134. Here, the semiconductor layer 134 may be formed of at least one of an amorphous semiconductor material, a polycrystalline semiconductor material or an oxide semiconductor material.

The light emitting device 210 includes an anode 222, an emission stack 224 formed on the anode 222, and a cathode 226 formed on the emission stack 224.

The anode may be conductively connected to the drain electrode 138 or the source electrode 136 of the driving thin film transistor 130 (T2) exposed through a pixel contact hole 116 formed through a pixel planarization layer 118.

Here, at least one emission stack 224 is formed on the anode 222 in an emission region prepared by a bank 128. The at least one emission stack 224 may be formed by stacking a hole-related layer, an emission layer and an electron-related layer on the anode 222 in regular order or in reverse order. In addition, the at least one emission stack 224 may include first and second emission stacks disposed opposite to each other with a charge generation layer interposed there between. In this case, one of the first and second emission stacks may emit blue light and the other of the first and second emission stacks may emit yellow-green light, and thereby the first and second emission stacks may produce white light. The white light produced by the emission stack 224 is incident upon a color filter located on the upper or lower surface of the emission stack 224, thereby being capable of implementing a color image. Otherwise, the respective emission stacks 224 of the light emitting devices 210 emit light with colors corresponding to the corresponding subpixels without separate color filters, thereby being capable of implementing a color image. For example, the emission stack 224 of the red (R) subpixel SP may emit red light, the emission stack 224 of the green (G) subpixel SP may emit green light, and the emission stack 224 of the blue (B) subpixel SP may emit blue light.

The hole-related layer may include at least one of a hole injection layer and a hole transport layer. Further, the electron-related layer may include at least one of an electron injection layer and an electron transport layer.

The cathode 226 may be formed opposite the anode 222 with the emission stack 224 interposed there between. The cathode 226 may be connected to a low voltage (VSS) supply line.

The encapsulation unit 140 prevents or at least reduces external moisture or oxygen from permeating the light emitting devices 210 which are vulnerable to external moisture or oxygen. For this purpose, the encapsulation unit 140 includes a first inorganic encapsulation layer 142 and a second inorganic encapsulation layer 146 and an organic encapsulation layer 144 disposed between the first inorganic encapsulation layer 142 and the second inorganic encapsulation layer 146, and one of the first inorganic encapsulation layer 142 and the second inorganic encapsulation layer 146 is disposed as the uppermost layer. Here, the encapsulation unit 140 includes at least two of the first inorganic encapsulation layer 142 and a second inorganic encapsulation layer 146 and at least one organic encapsulation layer 144. In the present disclosure, the structure of the encapsulation unit 140 in which an organic encapsulation layer 144 is disposed between the first inorganic encapsulation layer 142 and the second inorganic encapsulation layer 146 will be exemplarily described.

The first inorganic encapsulation layer 142 may be formed on the substrate 111 provided with the cathode 226 formed thereon so as to be located closest to the light emitting devices 210. The first inorganic encapsulation layer 142 may be formed of an inorganic insulating material which may be deposited at a low temperature, such as silicon nitride ($SiN_x$), silicon oxide ($SiO_x$) silicon oxynitride (SiON) or aluminum oxide ($Al_2O_3$). Further, the first inorganic encapsulation layer 142 may be formed of as a single layer structure or a multilayer structure. Because the first inorganic encapsulation layer 142 is deposited at a low temperature, damage to the emission stacks 224 of the light emitting devices 210, which are vulnerable to high temperature, may be prevented or at least reduced during the deposition process of the first inorganic encapsulation layer 142.

The organic encapsulation layer 144 serves as a buffer layer which relieves stress between respective layers caused by bending of the display device, and strengthens planarization performance. The organic encapsulation layer 144 is formed of an organic insulating material, such as an acrylic resin, an epoxy resin, polyimide, polyethylene or silicon oxycarbide (SiOC).

When the organic encapsulation layer 144 is formed through an inkjet method, at least one dam 106 may be disposed so as to prevent or at least reduce the organic encapsulation layer 144 in a liquid state from diffusing towards the edge of the substrate 111. The at least one dam 106 may prevent or at least reduce the organic encapsulation layer 144 from diffusing towards a pad area PDA, in which touch pads 170 and display pads 104 are disposed, at the outermost edge of the substrate 111. For this purpose, as shown in FIG. 2, the at least one dam 106 may be formed to completely surround the active area AA in which the light emitting devices 210 are disposed. However, the at least one dam 106 is not limited thereto, the at least one dam 106 may be formed only between the active area AA and the pad area PDA. When the pad area PDA, in which the touch pads 170 and the display pads 104 are disposed, is disposed at one side of the substrate 111, the at least one dam 106 may be disposed only at the corresponding side of the substrate 111. When the pad area PDA, in which the touch pads 170 and the display pads 104 are disposed, is disposed at both sides of the substrate 111, the at least one dam 106 may be disposed at the two sides of the substrate 111. The at least one dam 106 is formed in a single layer structure or a multilayer structure. The at least one dam 106 may be formed of the same material at the same time as at least one of the pixel planarization layer 118, the bank 128 or spacers.

The second inorganic encapsulation layer 146 may be formed on the substrate 111 provided with the organic encapsulation layer 144 formed thereon so as to the upper and side surfaces of the organic encapsulation layer 144 and the first inorganic encapsulation layer 142. The second inorganic encapsulation layer 146 may reduce or prevent permeation of external moisture or oxygen into the first inorganic encapsulation layer 142 and the organic encapsulation layer 144. The second inorganic encapsulation layer 146 may be formed of an inorganic insulating material, such as silicon nitride ($SiN_x$), silicon oxide ($SiO_x$), silicon oxynitride (SiON) or aluminum oxide ($Al_2O_3$). Further, the second inorganic encapsulation layer 146 may be formed in a single layer structure or a multilayer structure.

A touch buffer film 148 may be disposed on the encapsulation unit 140, and a black matrix 1000 may be disposed on the touch buffer film 148. Further, the touch sensors Cm including a first sensor layer 152 and a second sensor layer 154, which are disposed so as to intersect each other with the black matrix 1000 interposed there between, are disposed. Here, the first sensor layer 152 may be a touch driving line, and the second sensor layer 154 may be a touch sensing line.

The touch sensor Cm may be charged with electric charges due to a touch driving pulse supplied to the first sensor layer 152, and may discharge the electric charges to the second sensor layer 154.

The first sensor layer 152 includes a plurality of first touch electrodes 152e, and first bridge electrodes 152b configured to conductively connect the first touch electrodes 152e.

The first touch electrodes 152e may be disposed on the upper surface of the black matrix 100 so as to be spaced apart from each other by a designated interval in a first direction, i.e., an X-axis direction. Each of the first touch electrodes 152e may be conductively connected to adjacent first touch electrodes 152e by the first bridge electrodes 152b.

The first bridge electrodes 152b are disposed on the same plane as the second touch electrodes 154e in the same plane on the black matrix 1000, and may be conductively connected to the second touch electrodes 154e without separate contact holes.

The second sensor layer 154 includes a plurality of second touch electrodes 154e, and second bridge electrodes 154b configured to conductively connect the second touch electrodes 154e.

The second touch electrodes 154e may be disposed on the black matrix 1000 so as to be spaced apart from each other by a designated interval in a second direction, i.e., a Y-axis direction. Each of the second touch electrodes 154e may be conductively connected to adjacent second touch electrodes 154e by the second bridge electrodes 154b.

The second bridge electrodes 154b may be formed on the touch buffer film 148 formed of an insulating material, may be exposed through touch contact holes 150 formed through the black matrix 1000, and may be conductively connected to the second touch electrode 154e. For example, referring to FIG. 4, the second bridge electrodes 154b may be disposed between the touch buffer film 148 and the black matrix 1000, and may be connected to the second touch electrodes 154e disposed on the black matrix 1000 through the touch contact holes 150 in the black matrix 1000.

As shown in FIG. 3, the first and second touch electrodes 152e and 154e and the first bridge electrodes 152b disposed on the upper surface of the black matrix 1000 may not overlap the emission regions of the respective subpixels SP, and may overlap the bank 128. Further, the first and second touch electrodes 152e and 154e and the first bridge electrodes 152b may be formed in a mesh type. The second bridge electrodes 154b disposed on the touch buffer film 148 may not overlap the emission regions of the respective subpixels SP, and may overlap the bank 128. Further, the second bridge electrodes 154b located between the touch buffer film 148 and the black matrix 1000 may be formed in a V-shape. Therefore, the first and second touch electrodes 152e and 154e and the first and second bridge electrodes 152b and 154b are disposed so as not to overlap the emission regions of the respective subpixels SP, and thus, deterioration of the aperture ratio and transmittance of the touch display device 1 due to the first and second touch electrodes 152e and 154e and the first and second bridge electrodes 152b and 154b may be prevented or at least reduced.

Referring to FIG. 4, openings 1550 may be formed through the black matrix 1000. The openings 1550 are disposed so as to overlap the emission regions of the respective subpixels SP, i.e., to correspond to regions in which the light emitting devices 210 are disposed. The openings 1550 may be formed to expose some parts of the upper surface of the touch buffer film 148 disposed under the black matrix 1000 by removing some regions of the black matrix 1000. Therefore, the openings 1550 formed by removing the black matrix 1000 may serve as the upper surface of the touch buffer film 148 and the side surface of the black matrix 1000. Therefore, each of the openings 1550 may include a lower surface formed of the exposed upper surface of the touch buffer film 148, and a side surface formed of the exposed side surface of the black matrix 1000.

Color filters 1500 may be disposed in the opening 1550. Therefore, the black matrix 1000 may be disposed between the color filters 1500 so as to overlap the bank 128. The black matrix 100 may divide respective subpixel regions from each other and serve to prevent or at least reduce optical interference and light leakage between adjacent subpixel regions. The black matrix 1000 may be formed of a black insulating material having high resistance. The openings 1550 and the color filters 1500 disposed in the openings 1550 may be designed to have a width equal to or greater than the width of the emission regions exposed from the bank 128. The emission regions may be defined as regions in which the lower surface of the emission stack 224 directly contacts the upper surface of the anode 222 by removing the bank 128 disposed on the anode 222.

The color filters 1500 disposed in the openings 1550 may be formed using an inkjet printing method, or may be formed through a photolithography process. This figure illustrates the color filters 1500 as being formed by injecting color inks using the inkjet printing method and then hardening the color inks.

The color filters 1500 may be formed on some parts of the upper surface of the buffer film 148 exposed through the openings 1550 and some parts of the side surface of the black matrix 1000 exposed through the openings 1550.

When the amount of the color inks of the color filters 1500 used to fill the openings 1550 using the inkjet printing method is set to an excessively large amount, the color inks may overflow the openings 1550 and flow to adjacent subpixels configured to emit light with different colors.

In order to prevent or at least reduce such a problem, the touch buffer film 148 may be formed of a hydrophilic material, i.e., a material which has strong affinity for the color inks of the color filters 1500, and the black matrix 1000 may be formed of a hydrophobic material, i.e., a material which repels the color inks.

Therefore, repulsive force may be generated between the color filters 1500 and the hydrophobic black matrix 1000, and attractive force may be generated between the color filters 1500 and the hydrophilic touch buffer film 148. Therefore, even though the applied thickness of the black matrix 1000, i.e., the height of the black matrix 1000, is low, overflow of the color inks of the color filters 1500 to adjacent subpixels configured to emit light with different colors may be prevented or at least reduced.

When the color inks of the color filters 1500 repel the material of the black matrix 1000, the color inks have repulsive force with respect to the black matrix 1000, and is thus formed in a convex shape. When the color inks formed in the convex shape are hardened, the color filters 1500 may be formed in a convex shape based on the upper surface of the black matrix 1000.

Referring to FIGS. 4 and 5, the touch display device 1 according to one embodiment of the present disclosure may include the active area AA in which the light emitting devices 210 are disposed, and a bezel area BZ disposed adjacent to the active area AA. The bezel area BZ may include a first bezel area BZ1 disposed adjacent to the active area AA, the pad area PDA in which the touch pads 170 are disposed, and a second bezel area BZ2 disposed between the first bezel area BZ1 and the pad area PDA. The dam 106 disposed adjacent to the organic encapsulation layer 144 of the encapsulation unit 140 may be formed in the first bezel area BZ1.

In the second bezel area BZ2 in which the touch pads 170 are disposed, the display pads 104 may also be disposed. For example, the display pads 104 may be disposed between the touch pads 170. Alternatively, the touch pads 170 may be disposed between the display pads 104. Although, in the present disclosure, both touch pads 170 and the display pads 104 are disposed at one side of the display panel, the touch pads 170 and the display pads 104 are not limited thereto. For example, the touch pads 170 may be disposed at one side of the display panel, and the display pads 104 may be disposed at the other side of the display panel. Therefore, the disposition of the touch pads 170 and the display pads 104 are not limited to the structure of FIG. 2, and may be variously changed depending on the design of the touch display device 1.

As shown in FIG. 2, the display pads 104 are formed to have the same stack structure as the touch pads 170. However, the display pads 104 are not limited thereto, and may be formed to have a different stack structure from the touch pads 170.

The touch display device 1 according to one embodiment of the present disclosure includes routing lines 160 disposed in the bezel area BZ. The routing lines 160 transmit a touch driving signal generated by a touch driver to the first sensor layer 152 through the touch pads 170, and transmit a touch signal from the second sensor layer 154 to the touch driver through the touch pads 170.

Therefore, the routing lines 160 may be formed between each of the first and second touch electrodes 152e and 154e and the touch pads 170. Further, the routing lines 160 may conductively connect each of the first and second touch electrodes 152e and 154e and the touch pads 170. As shown in FIG. 2, the routing lines 160 may extend from the second touch electrodes 154e to at least one of left or right sides of the active area AA, and may be connected to the touch pads 170 in the pad area PDA. The routing lines 160 may extend from the first touch electrodes 152e to at least one of upper and lower sides of the active area AA, and may be connected to the touch pads 170. Such disposition of the routing lines may be variously changed according to the design of the touch display device 1. The routing lines 160 may be disposed on at least one dam 106 so as to intersect the at least one dam 106, and may be disposed along the side surface of the encapsulation unit 140. Therefore, the routing lines 160 may overlap the upper surface of the at least one dam 106.

The routing lines 160 and the first and second touch electrodes 152e and 154e may be selectively formed on the same plane. For example, in the same manner as the first and second touch electrodes 152e and 154e disposed on the black matrix 1000 in the active area AA, the routing lines 160 may be disposed on the black matrix 1000 in the active area AA, the first bezel area BZ1 and the second bezel area BZ2.

However, the routing lines 160 are not limited thereto, and the routing lines 160 and the first and second touch electrodes 152e and 154e may be disposed on different planes. For example, as shown in FIGS. 4 and 5, the routing lines 160 may be disposed on the black matrix 1000 in the first bezel area BZ1 and the active area AA. Further, the routing lines 160 may be disposed on the touch buffer film 148 in the second bezel area BZ2. FIG. 5 illustrates the case in which the routing lines 160 are disposed on the touch buffer film 148 in the second bezel area BZ2, and are disposed on the black matrix 1000 in the first bezel area BZ1 and the active area AA.

The case in which the routing lines 160 are disposed on the black matrix 1000 in the first bezel area BZ1 and the active area AA, and are disposed on the touch buffer film 148 in the second bezel area BZ2 will be described in more detail. Referring to FIG. 5, the black matrix 1000 may be disposed in the active area AA and the first bezel area BZ1, but may not be disposed in some regions of the second bezel area BZ2. Therefore, in the second bezel area BZ2 among the bezel area BZ, the routing lines 160 may contact the upper surface of the touch buffer film 148.

Referring to FIGS. 4 and 5, the first and second touch electrodes 152e and 154e and the routing lines 160 may be disposed on the black matrix 1000 in the active area AA and the first bezel area BZ1. The openings 1550 and the touch contact holes 150 may be formed in the black matrix 1000, thereby being capable of exposing some parts of the touch buffer film 148, disposed under the black matrix 1000, and the second bridge electrodes 154b.

Further, when the openings 1550 and the touch contact holes 150 are formed by removing some regions of the black matrix 1000 disposed in the active area AA, some regions of the black matrix 1000 disposed in the bezel area BZ may be removed.

Therefore, the black matrix 1000 disposed in the second bezel area BZ2 and the pad area PDA among the bezel area BZ may be selectively removed. For example, when the second bezel area BZ2 include a bending region, the black matrix 1000 may be removed from the bending region of the second bezel area BZ2. Further, in order to connect third touch pad electrodes 176 extending from the routing lines 160 to second touch pad electrodes 174 and first touch pad electrodes 172 in the pad area PDA, at least a part of the black matrix 1000 may be removed.

Therefore, the routing lines 160 and the first and second touch electrodes 152e and 154e may be disposed on different layers. Further, the third touch pad electrodes 176 formed of the same material to have the same stack structure as the routing lines 160 may be disposed on different layers from the first and second touch electrodes 152e and 154e. The first and second touch electrodes 152e and 154e and some parts of the routing lines 160 may be disposed on the black matrix 1000 in the first bezel area BZ1. Further, the routing lines 160 may be disposed on the touch buffer film 148 in the second bezel area BZ2. The third touch pad electrodes 176 having the same stack structure as the routing lines 160 may be disposed on the second touch pad electrodes 174 in the pad area PDA.

The case in which the routing lines 160 are disposed on the black matrix 1000 in the active area AA, the first bezel area BZ1 and the second bezel area BZ2, in the same manner as the first and second touch electrodes 152e and 154e disposed on the black matrix 1000 in the active area AA, will be described. In this case, the black matrix 1000 may be disposed in the first bezel area BZ1, the second bezel area BZ2 and the pad area PDA among the bezel area BZ. However, in order to form first pad contact holes 178a in the pad area PDA, some regions of the black matrix 1000 may be removed. Therefore, the first and second touch electrodes 152e and 154e and the routing lines 160 may be formed on the same layer, i.e., the black matrix 1000, in the first bezel area BZ1 and the second bezel area BZ2. Further, the third touch pad electrodes 176 may be disposed on the second touch pad electrodes 174 exposed through the first pad contact holes 178a in the pad area PDA.

Because the second touch pad electrodes 174 and the touch buffer film 148 do not react to a chemical solution (for example, a developer) used during a process for forming the openings 1550 and the touch contact holes 150 in the black matrix 1000, the black matrix 1000 disposed on the second touch pad electrodes 174 and the touch buffer film 148 in the bezel area BZ may be selectively removed.

Further, each of the first sensor layer 152 and the second sensor layer 154 according to one embodiment of the present disclosure may be conductively connected to the touch driver (not shown) through the routing lines 160 and the touch pads 170. The touch pads 170 may be connected to a signal transfer film (not shown) on which the touch driver is mounted.

Each of the touch pads 170 disposed in the pad area PDA may include the first to third touch pad electrodes 172, 174 and 176. The first touch pad electrode 172 may be disposed on at least one of the substrate 111, the buffer layer 112 or the interlayer insulating film 114 which is disposed below the encapsulation unit 140.

The first touch pad electrode 172 may be formed of the same material on the same plane as at least one of the gate electrode 132 or the source electrode 136 and drain electrode 138 of the driving transistor 130 (T2), and may be formed in a single layer structure or a multilayer structure. The first touch pad electrode 172 may have the same stack structure as at least one of the gate electrode 132 or the source electrode 136 and the drain electrode 138. For example, the first touch pad electrode 172, which is formed of the same material as the source electrode 136 and the drain electrode 138 and disposed on the interlayer insulating film 114, is illustrated. Therefore, the first touch pad electrode 172 may be formed through the same mask process as the source electrode 136 and the drain electrode 138. Therefore, the first touch pad electrode 172 may have the same stack structure as the source electrode 136 and the drain electrode 138.

The second touch pad electrode 174 may be conductively connected to the first touch pad electrode 172 exposed through the first pad contact hole 178a formed through the touch buffer film 148. The second touch pad electrode 174 may be formed through the same mask process as the second bridge electrodes 154b, thus being capable of being formed of the same material on the same plane as the second bridge electrodes 154b. Further, the second touch pad electrode 174 may have the same stack structure as the second bridge electrodes 154b.

The third touch pad electrode 176 may be conductively connected to the second touch pad electrode 174 exposed from the black matrix 1000. The third touch pad electrode 176 may be formed through the same mask process as the first and second touch electrodes 152e and 154e. Therefore, the third touch pad electrode 176 may be formed of the same material as the first and second touch electrodes 152e and 154e. Further, the third touch pad electrode 176 may have the same stack structure as the first and second touch electrodes 152e and 154e. Therefore, the third touch pad electrode 176 may have the same stack structure as the routing lines 160 respectively extending from the first and second touch electrodes 152e and 154e. The third touch pad electrode 176 may extend from each of the routing lines 160.

As such, a cover layer 500 may be disposed on the substrate 111 provided with the encapsulation unit 140 and the touch sensors Cm disposed thereon.

The cover layer 500 may include a passivation layer 520, a black optical adhesive layer 550 disposed on the passivation layer 520, and a cover window 590 disposed on the black optical adhesive layer 550.

The passivation layer 520 and the black optical adhesive layer 550 and the cover window 590 may be disposed up to the first bezel area BZ1. However, the passivation layer 520 and the black optical adhesive layer 550 and the cover window 590 are not limited thereto, and may be disposed up to the second bezel area BZ2.

The black optical adhesive layer 550 may serve as both an adhesive layer and a polarization layer. The polarization layer serves to block light reflected by metals forming the touch electrodes 152 and 154. However, the black optical adhesive layer 550 may prevent or at least reduce reflection of external light and prevent or at least reduce color interference between the subpixels. Further, the black matrix 100 may block light reflected by the metals forming the touch electrodes 152 and 154, and thus, the touch display device 1 according to one embodiment of the present disclosure may display a clearer image. The black optical adhesive layer 550 may be implemented in black using a material in which a dye is combined with an adhesive sheet, such as an optically clear adhesive (OCA), so as to serve as both an adhesive layer and a polarization layer in a black color tone.

Further, the lower surface of the passivation layer 520 may have an uneven surface due to the touch electrodes 152 and 154 and the color filters 1500 disposed under the passivation layer 520. Further, the upper surface of the passivation layer 520 may have a flat surface. In order to form the upper surface of the passivation layer 520 as the flat surface, the passivation layer 520 may be formed of an organic material having fluidity. Thus, the passivation layer 520 may be formed of an organic material, such as an acrylic resin, an epoxy resin, polyimide, polyethylene or silicon oxycarbide (SiOC).

As such, the touch display device 1 according to one embodiment of the present disclosure may replace a touch insulating film with the black matrix 1000 and embed the color filters 1500 in the black matrix 1000, thereby being capable simplifying the structure of the touch display device 1 and the manufacturing process thereof.

Further, the touch display device 1 according to one embodiment of the present disclosure may replace the touch insulating film with the black matrix 1000 and embed color filters 1500 in the black matrix 1000 so as to realize slimness of the touch display panel, and may use the black optical adhesive layer 550 as a substitute for a polarization plate because the black optical adhesive layer 550 applied together with the black matrix 1000 may reduce reflectance.

Figure 6:
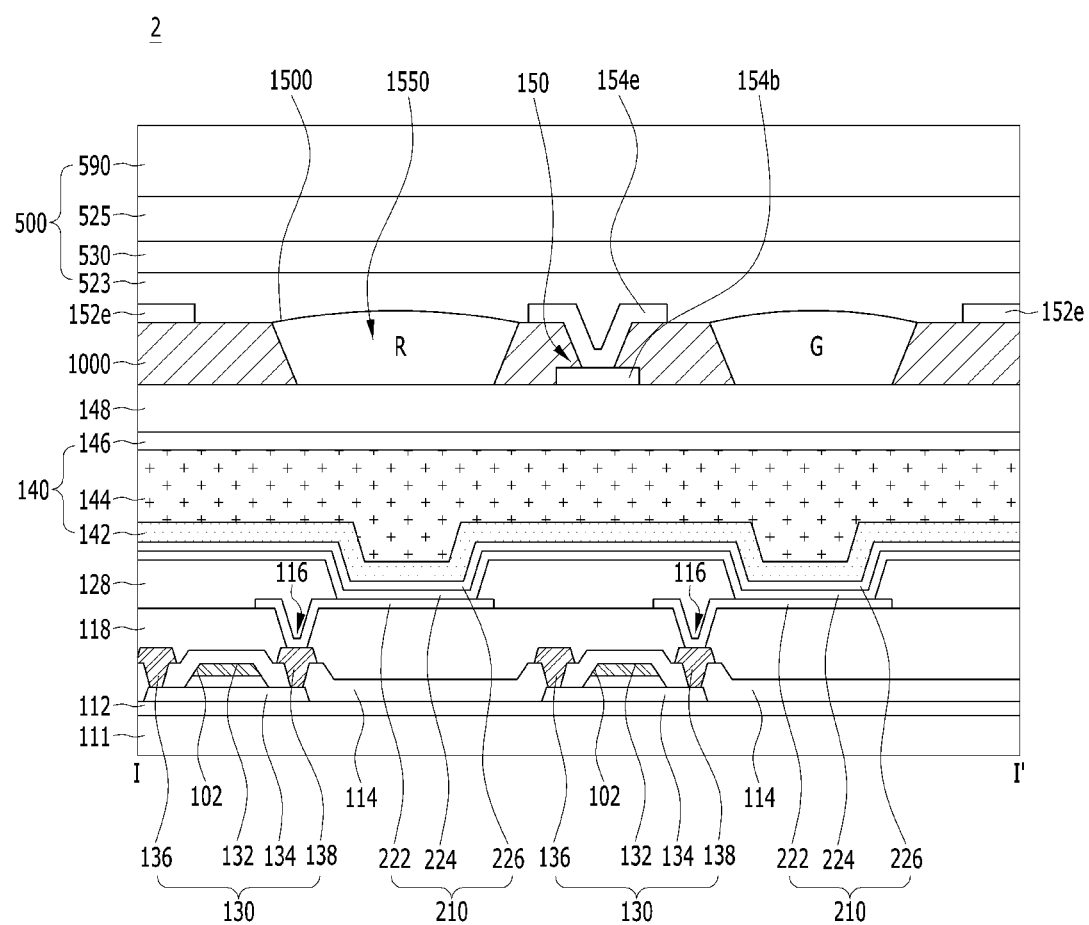
FIG. 6 is a longitudinal-sectional view of a touch display device according to another embodiment of the present disclosure.
Figure 7:
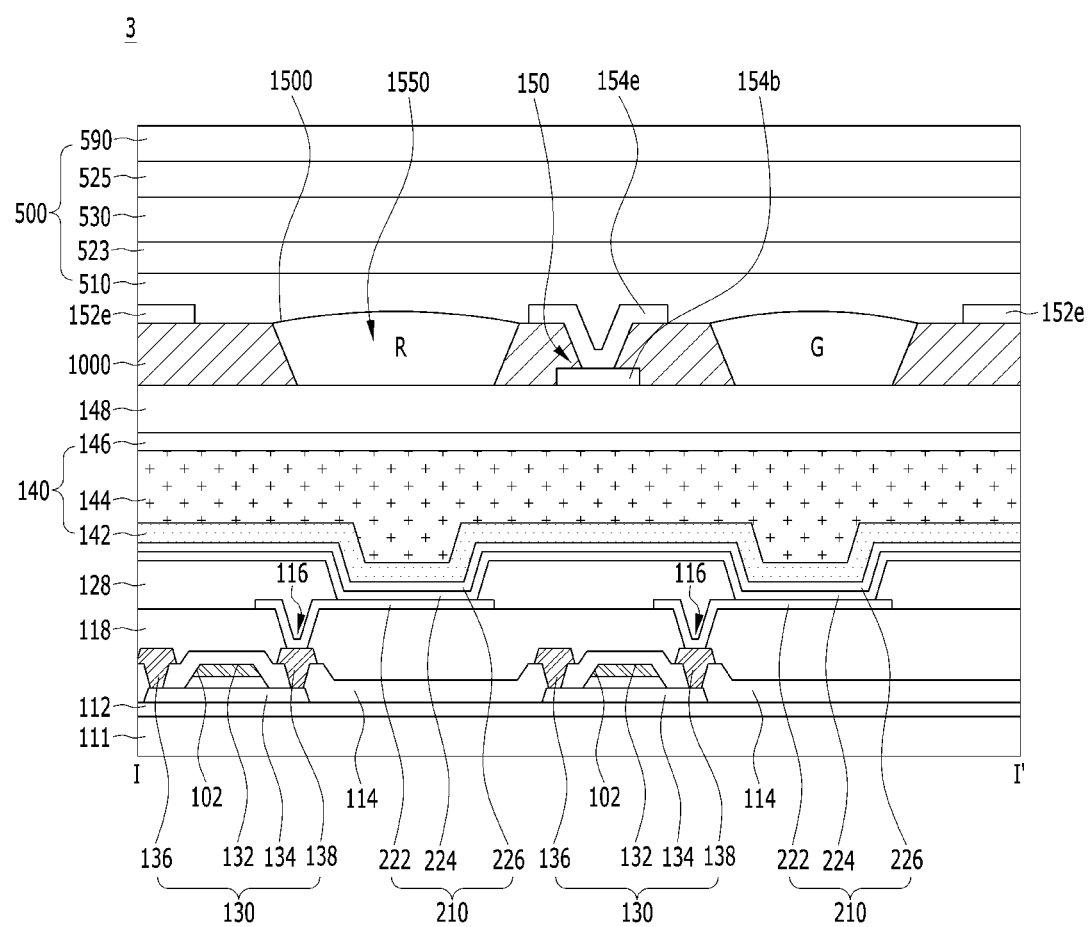
FIG. 7 is a longitudinal-sectional view of a touch display device according to yet another embodiment of the present disclosure.

FIG. 6 is a longitudinal-sectional view of a touch display device according to another embodiment of the present disclosure, and FIG. 7 is a longitudinal-sectional view of a touch display device according to yet another embodiment of the present disclosure.

A detailed description of some parts in these embodiments shown in FIGS. 6 and 7, which are substantially the same as those in the former embodiment shown in FIGS. 1 to 5, will be omitted to avoid redundancy, and FIGS. 1 to 5 will be cited for ease of description.

Referring to FIG. 6, a touch display device 2 according to another embodiment of another embodiment of the present disclosure includes a first optical adhesive layer 523 disposed on a black matrix 1000, a polarization layer 530 disposed on the first optical adhesive layer 523, a second optical adhesive layer 525 disposed on the polarization layer 530, and a cover window layer 590 disposed on the second optical adhesive layer 525. Here, the polarization layer 530 may be used to block light reflected by metals forming touch electrodes 152 and 154.

The first optical adhesive layer 523 may be disposed between a lower layer including the black matrix 1000 and the polarization layer 530, and may serve to adhere the black matrix 1000 and the polarization layer 530 to each other. The polarization layer 530 may be formed by applying a polarizing material to the black matrix 1000, or may be formed as a separate component. Therefore, the polarization layer 530 may be adhered to the black matrix 1000 by interposing a layer, which may adhere the lower layer including the black matrix 1000 and the polarization layer 530 to each other, there between. The polarization layer 530 may employ polyvinyl alcohol (PVA), triacetyl cellulose (TAC) or the like. Further, the second optical adhesive layer 525 may exhibit the same function as the first optical adhesive layer 523. Here, the first and second optical adhesive layers 523 and 525 may employ an optically clear adhesive (OCA).

Referring to FIG. 7, a touch display device 3 according to yet another embodiment of another embodiment of the present disclosure includes a passivation layer 510 disposed on a black matrix 1000, a first optical adhesive layer 523 disposed on the passivation layer 510, a polarization layer 530 disposed on the first optical adhesive layer 523, a second optical adhesive layer 525 disposed on the polarization layer 530, and a cover window layer 590 disposed on the second optical adhesive layer 525. Here, the polarization layer 530 may be used to block light reflected by metals forming touch electrodes 152 and 154.

The passivation layer 510 may protect the black matrix 1000, color filters 1500 and the touch electrodes 152 and 154 disposed under the passivation layer 510 from external moisture, oxygen and foreign substances.

As such, the touch display devices 2 and 3 according to these embodiments of the present disclosure may realize slimness of a touch display panel, may reduce reflectance through use of the polarization layer 530, and protect structures located under the passivation layer 510 from foreign substances.

FIGS. 8 to 12 are longitudinal-sectional views illustrating a method for manufacturing the touch display device according to one embodiment of the present disclosure.

A detailed description of some parts of the method shown in FIGS. 8 to 12, which are substantially the same as those in the embodiment shown in FIGS. 1 to 5, will be omitted to avoid redundancy, and FIGS. 1 to 5 will be cited for ease of description.

Figure 8:
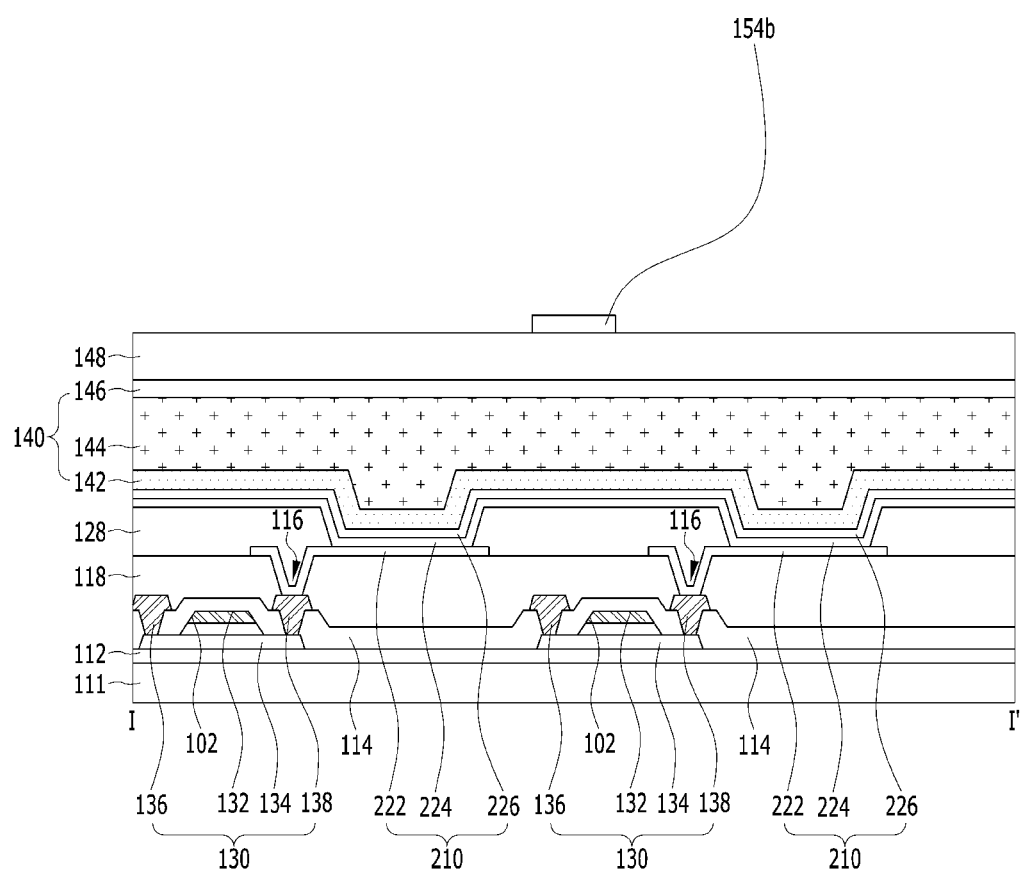
FIGS. 8 to 12 are longitudinal-sectional views illustrating a method for manufacturing the touch display device according to one embodiment of the present disclosure.

As shown in FIG. 8, a first touch metal layer is deposited onto the entire surface of the substrate 111 provided with the encapsulation unit 140 and the touch buffer film 148 formed thereon. The second bridge electrodes 154b and the second touch pad electrodes 174 may be formed by patterning the first touch metal layer through a mask process.

Here, the first touch metal layer is formed to have a single layer structure or a multilayer structure using a metal, such as aluminum (Al), titanium (Ti), copper (Cu), molybdenum (Mo), tantalum (Ta) or molybdenum-titanium (MoTi). For example, the first touch metal layer may be formed to have a three-layer stack structure, such as titanium/aluminum/titanium (Ti/Al/Ti), molybdenum-titanium/copper/molybdenum-titanium (MoTi/Cu/MoTi) or titanium/aluminum/molybdenum (Ti/Al/Mo).

Figure 9:
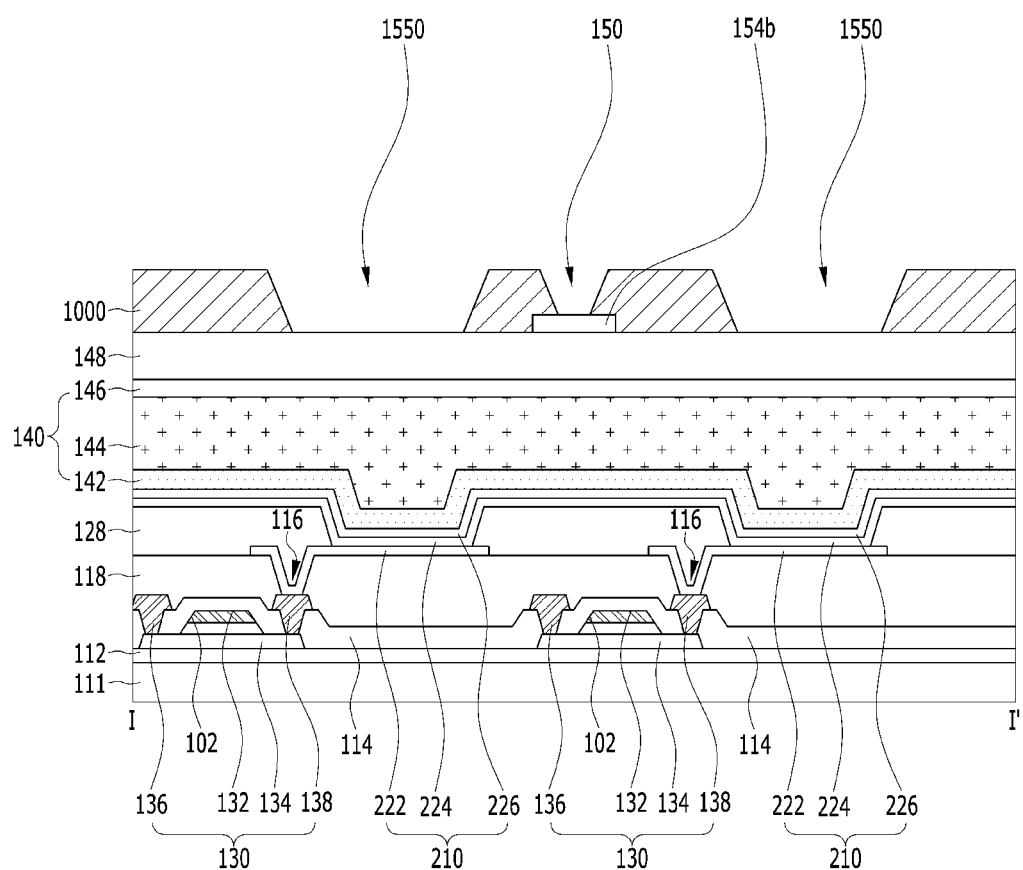

As shown in FIG. 9, a matrix material is deposited onto the entire surface of the substrate 111 provided with the second bridge electrodes 154b and the second touch pad electrodes 174 formed thereon. The black matrix 100 and the touch contact holes 150, and the openings 1550 and second pad contact holes 178b formed therein may be formed by patterning the black matrix material through a mask process.

Here, the touch contact holes 150 may be disposed at positions, each of which corresponds to a part of a corresponding one of the second bridge electrodes 154b, and second pad contact holes 178b may be disposed at positions corresponding to the first touch pad electrodes 172. Further, the openings 1550 may be formed at positions corresponding to the anodes 222.

During the manufacturing process of the black matrix 1000, the second bridge electrodes 154b and the second touch pad electrodes 174 may be protected. That is to say, because the second bridge electrodes 154b and the second touch pad electrodes 174 do not react to a chemical solution (for example, a developer) used during the manufacturing process of the black matrix 1000, corrosion of the second bridge electrodes 154b and the second touch pad electrodes 174 may be prevented or at least reduced.

Figure 10:
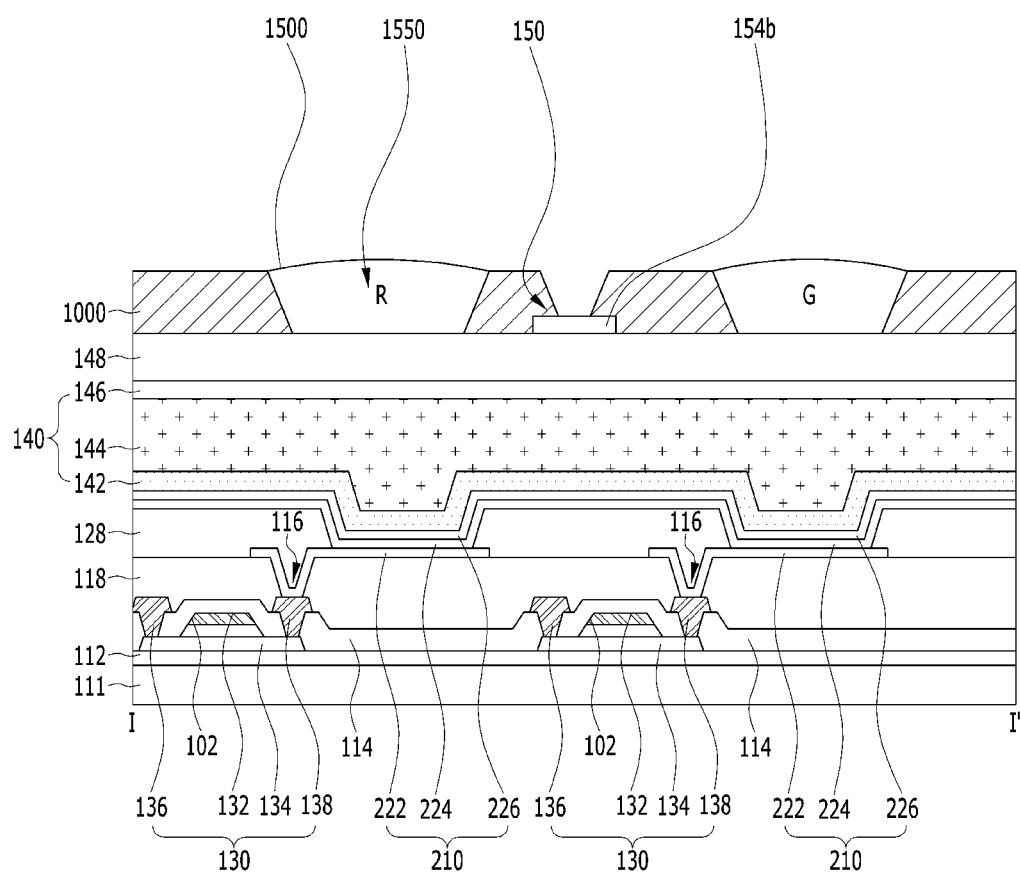

As shown in FIG. 10, the color filters 1500 may be formed by injecting color inks into the openings 1550 using the inkjet printing method and hardening the color inks.

Because the black matrix 1000 may be formed of a hydrophobic material, i.e., a material which repels the color inks, the color filters 1500 may be formed in a convex shape based on the upper surface of the black matrix 1000.

As such, in the method for manufacturing the touch display device according to one embodiment of the present disclosure, the color filters 1500 are formed in the openings 1550 formed in the black matrix 1000 using the inkjet printing method, and thus, the manufacturing process of the touch display device may be simplified.

Figure 11:
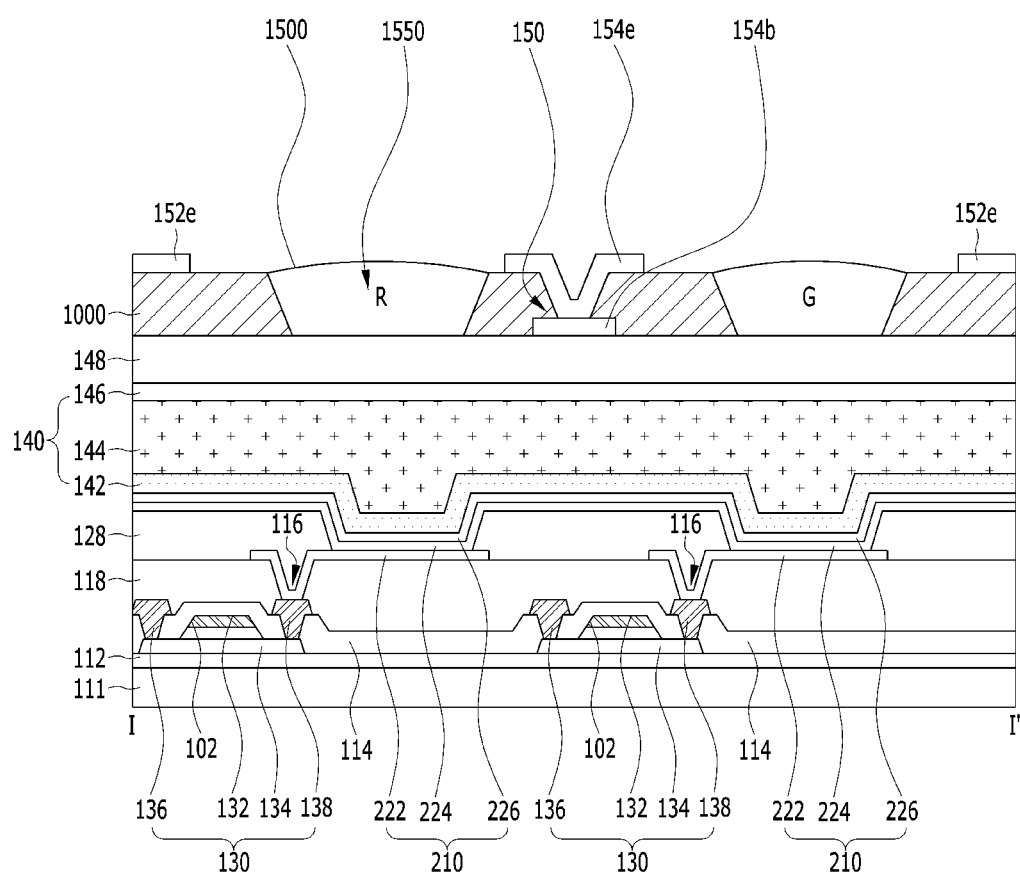

As shown in FIG. 11, a second touch metal layer is deposited onto the entire surface of the substrate 111 provided with the color filters 1500 filling the openings 1550 and the touch contact holes 150 configured to open the second bridge electrodes 154b, and is then patterned through a mask process. The first and second touch electrodes 152e and 154e, the first bridge electrodes 152b, the routing lines 160 and the third touch pad electrodes 176 may be formed by patterning the second touch metal layer. Here, the second touch metal layer is formed to have a single layer structure or a multilayer structure using a metal, such as aluminum (Al), titanium (Ti), copper (Cu), molybdenum (Mo), tantalum (Ta) or molybdenum-titanium (MoTi). For example, the second touch metal layer may be formed to have a three-layer stack structure, such as titanium/aluminum/titanium (Ti/Al/Ti), molybdenum-titanium/copper/molybdenum-titanium (MoTi/Cu/MoTi) or titanium/aluminum/molybdenum (Ti/Al/Mo).

Figure 12:
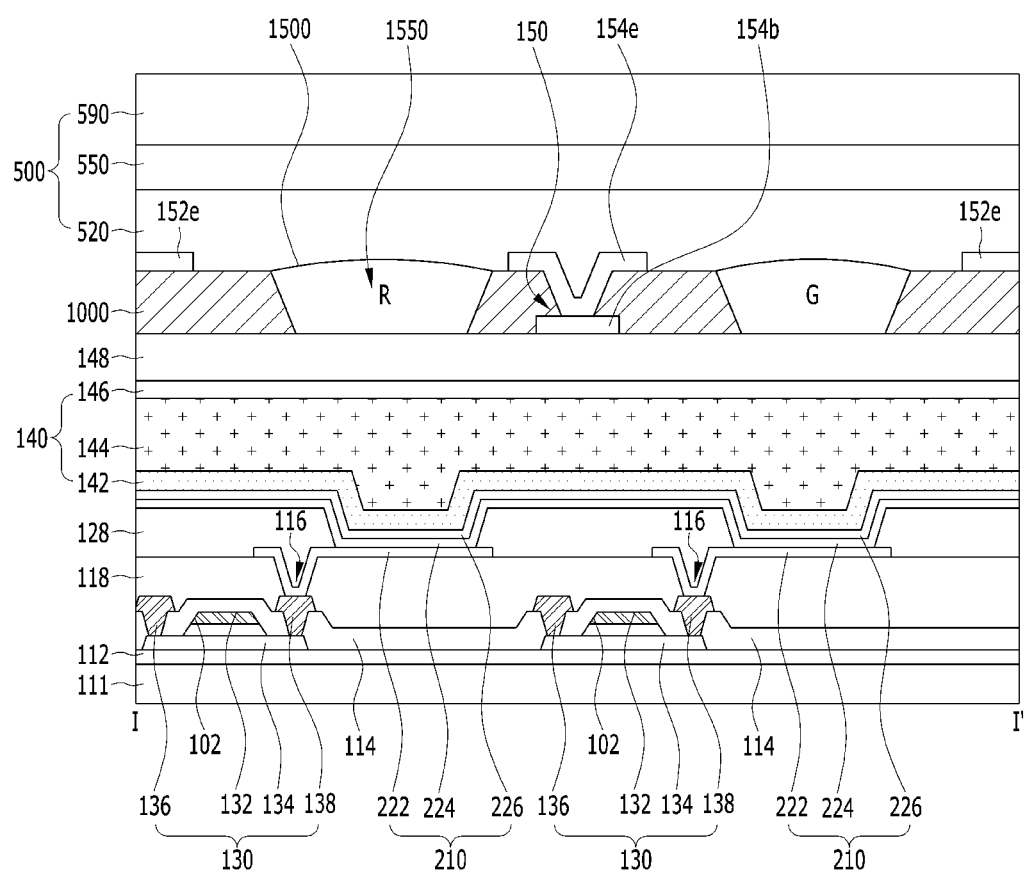

As shown in FIG. 12, the cover layer 500 may be formed on the substrate 111 provided with the first and second touch electrodes 152e and 154e and the first bridge electrodes 152b formed thereon. The cover layer 500 may include the cover window 590.

Here, the black optical adhesive layer 550 may be further disposed between the cover window 590 and the substrate 111 provided with the first and second touch electrodes 152e and 154e and the first bridge electrodes 152b formed thereon.

Otherwise, the passivation layer 510 may be formed on the substrate 111 provided with the first and second touch electrodes 152e and 154e and the first bridge electrodes 152b formed thereon, and may be adhered to the cover window 590 by an optical adhesive layer disposed on the passivation layer 510.

Figure 13:
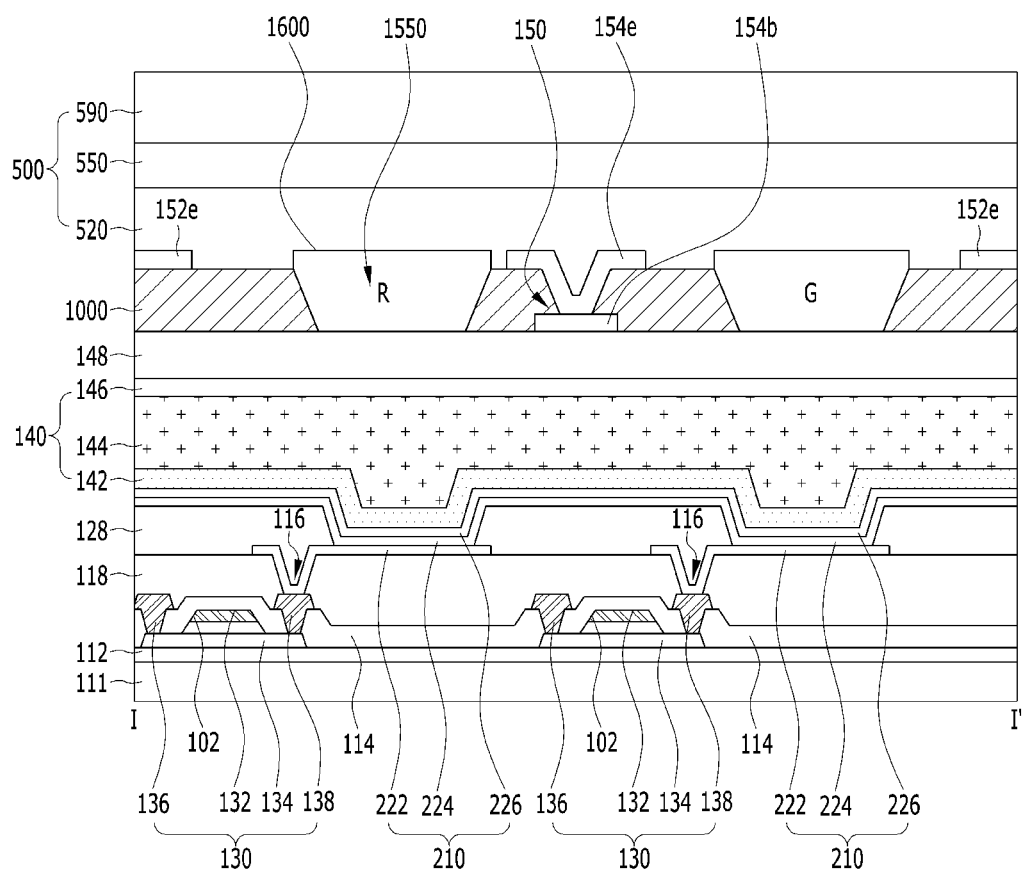
FIGS. 13 and 14 are longitudinal-sectional views of a touch display device according to still another embodiment of the present disclosure.
Figure 14:
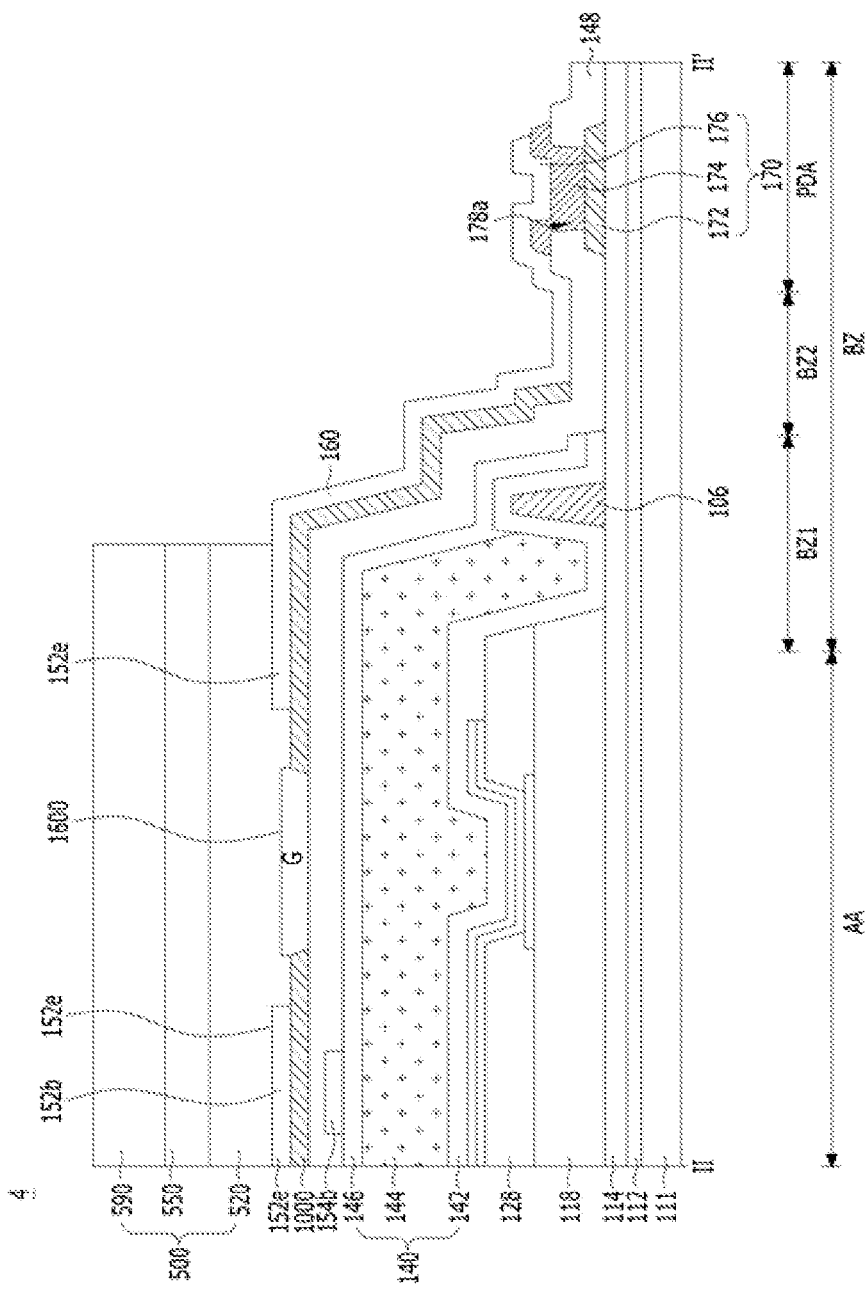

FIGS. 13 and 14 are longitudinal-sectional views of a touch display device according to still another embodiment of the present disclosure. Here, FIG. 13 illustrates the structure of an active area of the touch display device according to still another embodiment of the present disclosure, and FIG. 14 illustrates the structure of a bezel area of the touch display device according to still another embodiment of the present disclosure.

A detailed description of some parts in this embodiment shown in FIGS. 13 and 14, which are substantially the same as those in the former embodiment shown in FIGS. 1 to 5, will be omitted to avoid redundancy, and FIGS. 1 to 5 will be cited for ease of description.

Referring to FIGS. 13 and 14, in a touch display device 4 according to still another embodiment of the present disclosure, color filters 1600 may be formed in a different shape from the color filters 1500 of the touch display device 1 according to one embodiment of the present disclosure.

In the touch display device 1 according to one embodiment of the present disclosure, the color filters 1500 may be formed using the inkjet printing method, and may thus have a convex shape based on the upper surface of the black matrix 1000.

On the other hand, in the touch display device 4 according to still another embodiment of the present disclosure, the color filters 1600 may be formed using a photomask process, and may thus be formed in a protruding shape from the upper surface of the black matrix 1000.

Here, openings 1550 may be formed to have a tapered shape in the downward direction of the black matrix 1000. The black matrix 1000 is formed of an opaque material and thus absorbs light during a light exposure process, and thus it may be difficult to allow light to reach the touch buffer film 148 disposed under the black matrix 1000. For example, the material of the color filters 1600 may not be hardened. Therefore, the upper portion of each of the openings 1550 may be greater in size than the lower portion of each of the openings 1550 so that light may reach the touch buffer film 148 disposed under the color filter 1600.

Further, because the application thickness of the black matrix 1000 may be equal to the thickness of the openings 1550, the material of the color filters 1600 may require a greater amount than the amount to fill the openings 1550 of the black matrix 100 for forming the application thickness. For example, when the colors filters 1600 are formed of an organic material having fluidity, the color filters 1550 formed by hardening the organic material may have a flat upper surface while filling the openings 1550.

Therefore, in order to form the color filters 1550 having a flat upper surface while filling the openings 1550, a greater amount of the material of the color filters 1600 than the amount to fill the openings 1550 may be provided to the substrate 111.

Further, as the light exposure process is performed so as to correspond to regions between the upper portions of the openings 1550, the color filters 1600 may have a protruding surface from the upper surface of the black matrix 1000 so as to form a step with the upper surface of the black matrix 1000. That is to say, the color filters 1600 may be formed to protrude from the upper portions of the corresponding openings 1550.

In the bezel area BZ, the black matrix 1000 may be disposed on the touch buffer film 148. In the above-described embodiment of the present disclosure, the black matrix 1000 may be selectively disposed on the touch buffer film 148 in the bezel area BZ. For example, in the above-described embodiment of the present disclosure, the black matrix 1000 is removed from the first bezel area BZ1 and the pad area PDA of the bezel area BZ.

On the other hand, in this embodiment, the black matrix 1000 may be formed to be left in the bezel area BZ while touch contact holes 150 and the openings 1550 are formed through the black matrix 1000. Therefore, this embodiment describes that the black matrix 1000 may be disposed on the entire surfaces of the bezel area BZ.

As the black matrix 1000 is disposed in the pad area PDA, second touch pad contact holes 178b may be further formed through the black matrix 1000 in the pad area PDA, and third touch pad electrodes 176 having the same stack structure as routing lines 160 may be disposed in the second touch pad contact holes 178b.

As is apparent from the above description, a touch display device according to one embodiment of the present disclosure may replace a touch insulating film with a black matrix and embed color filters in the black matrix, thereby being capable of simplifying the structure of the touch display device and the manufacturing process thereof.

Further, the touch display device according to one embodiment of the present disclosure may replace the touch insulating film with the black matrix and embed the color filters in the black matrix so as to realize slimness of a touch display panel, and may use a black optical adhesive layer, applied together with the black matrix, as a substitute for a polarization plate so as to reduce reflectance.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:
1. A touch display device comprising:
 a substrate having an active area and a bezel area adjacent to the active area;
 light emitting devices disposed on the active area of the substrate;
 an encapsulation unit disposed on the light emitting devices;
 a touch buffer film disposed on the encapsulation unit, the touch buffer film including a first touch buffer film portion that is in the active area and a second touch buffer film portion that extends from the first touch buffer film portion in the active area to the bezel area;
 second bridge electrodes disposed on the touch buffer film;
 a black matrix disposed on the touch buffer film in the active area and the bezel area of the substrate, the black matrix comprising openings in the active area, a first black matrix portion in the active area that overlaps the first touch buffer film portion in the active area such that the first black matrix portion is farther from the substrate than the first touch buffer film portion in the active area, and a second black matrix portion in the bezel area that overlaps the second touch buffer film portion in the bezel area such that the second black matrix portion is farther from the substrate than the second touch buffer film portion in the bezel area;

color filters disposed to fill the openings; and a cover layer disposed on the color filters and the black matrix, wherein the black matrix covers the second bridge electrodes.

2. The touch display device according to claim 1, further comprising:

touch contact holes formed through the black matrix to expose a part of each of the second bridge electrodes;

a second sensor layer disposed on an upper surface of the black matrix, the second sensor layer comprising second touch electrodes disposed in the touch contact holes and connected to the second bridge electrodes; and a first sensor layer disposed on the black matrix, the first sensor layer comprising first touch electrodes and first bridge electrodes.

3. The touch display device according to claim 2, wherein all of the second touch electrodes, the first touch electrodes, and the first bridge electrodes overlap with a portion of the black matrix.

4. The touch display device according to claim 2, wherein color filters are non-overlapping with the second bridge electrodes and the second sensor layer.

5. The touch display device according to claim 1, wherein each of the openings has a lower surface that serves as an upper surface of the touch buffer film, and a side surface that serves as an exposed side surface of the black matrix.

6. The touch display device according to claim 1, wherein:

the touch buffer film is formed of a hydrophilic material with a strong affinity for the color filters; and the black matrix includes a hydrophobic material that repels a material of the color filters.

7. The touch display device according to claim 1, wherein the color filters have a convex shape with respect to an upper surface of the black matrix.

8. The touch display device according to claim 1, wherein the color filters have a protruding surface from an upper surface of the black matrix, the protruding surface forming a step with the upper surface of the black matrix.

9. The touch display device according to claim 8, wherein an upper portion of each of the openings is greater in size than a lower portion of each of the openings.

10. The touch display device according to claim 1, wherein the bezel area comprises:

a first bezel area disposed adjacent to the active area;

a pad area in which touch pads are disposed; and a second bezel area disposed between the first bezel area and the pad area, wherein the touch pads are conductively connected to routing lines that extend from the active area, wherein the encapsulation unit and the second black matrix portion are disposed in the first bezel area, and wherein the second touch buffer film portion is disposed in the first bezel area and a third touch buffer film portion of the touch buffer film that extends from the second touch buffer film portion is in the second bezel area and is non-overlapping with the black matrix in the second bezel area.

11. The touch display device according to claim 10, wherein the routing lines are disposed on the black matrix in the first bezel area and the active area, and are disposed on the touch buffer film in the second bezel area.

12. The touch display device according to claim 10, wherein each of the touch pads comprises:

a first touch pad electrode disposed on the substrate so that the touch buffer film is disposed on the first touch pad electrode;

a second touch pad electrode disposed on the first touch pad electrode; and a third touch pad electrode disposed on the second touch pad electrode, wherein the touch buffer film has a first touch pad contact hole that exposes first touch pad electrode, and the second touch pad electrode is disposed on the touch buffer film to contact to the first touch pad electrode.

13. The touch display device according to claim 12, wherein:

the first touch pad electrode comprises an identical metal as source and drain electrodes of thin film transistors formed on the substrate;

the second touch pad electrode comprises an identical metal as the second bridge electrodes; and the third touch pad electrode comprises an identical metal as a first sensor layer disposed on an upper surface of the black matrix.

14. The touch display device according to claim 1, wherein the cover layer comprises:

a passivation layer disposed on the black matrix;

a black optical adhesive layer disposed on the passivation layer; and a cover window disposed on the black optical adhesive layer.

15. The touch display device according to claim 1, wherein the cover layer comprises:

a first optical adhesive layer disposed on the black matrix;

a polarization layer disposed on the first optical adhesive layer;

a second optical adhesive layer disposed on the polarization layer; and a cover window disposed on the second optical adhesive layer.

16. The touch display device according to claim 1, wherein the cover layer comprises:

a passivation layer disposed on the black matrix;

a first optical adhesive layer disposed on the passivation layer;

a polarization layer disposed on the first optical adhesive layer;

a second optical adhesive layer disposed on the polarization layer; and a cover window layer disposed on the second optical adhesive layer.

* * * * *